(12) United States Patent
Witczak et al.

(10) Patent No.: US 12,082,347 B2
(45) Date of Patent: Sep. 3, 2024

(54) METHOD FOR PRINTING TRACES ON A SUBSTRATE AND AN ADDITIVE MANUFACTURING APPARATUS THEREFOR

(71) Applicant: XTPL S.A., Wrocław (PL)

(72) Inventors: Lukasz Witczak, Łódź (PL); Iwona Grądzka-Kurzaj, Wrocław (PL); Aneta Wiatrowska, dolnośląskie (PL); Karolina Fiączyk, Wrocław (PL); Filip Granek, Mrozów (PL)

(73) Assignee: XTPL S.A., Wroclaw (PL)

( * ) Notice: Subject to any disclaimer, the term of this patent is extended or adjusted under 35 U.S.C. 154(b) by 0 days.

(21) Appl. No.: 18/345,175

(22) Filed: Jun. 30, 2023

(65) Prior Publication Data
US 2024/0098903 A1    Mar. 21, 2024

Related U.S. Application Data

(60) Provisional application No. 63/375,760, filed on Sep. 15, 2022.

(51) Int. Cl.
*H05K 3/12* (2006.01)
(52) U.S. Cl.
CPC .................... *H05K 3/1241* (2013.01)

(58) Field of Classification Search
CPC .................................................... H05K 3/1241
See application file for complete search history.

(56) References Cited

U.S. PATENT DOCUMENTS

2007/0014974 A1 * 1/2007 Vronsky .............. H05K 3/1283
428/209
2022/0157629 A1 * 5/2022 Antoniolli ............. H01L 21/027

FOREIGN PATENT DOCUMENTS

WO    WO 2022/245729    * 11/2022

* cited by examiner

*Primary Examiner* — Austin Murata
(74) *Attorney, Agent, or Firm* — K&L Gates LLP (57) ABSTRACT

A method for printing traces on a substrate and an additive manufacturing apparatus therefor are provided. The method comprises determining at least two first location points for a first trace and at least two second location points for a second trace. The first trace and the second trace traverse at least two surfaces of the substrate, including a first surface of the substrate and a second surface of the substrate. At least two third location points are determined for a third trace based on the at least two first location points and the at least two second location points. The third trace is intermediate the first trace and the second trace. The third trace is formed on the at least two surfaces based on the at least two third location points.

21 Claims, 4 Drawing Sheets

METHOD FOR PRINTING TRACES ON A SUBSTRATE AND AN ADDITIVE MANUFACTURING APPARATUS THEREFOR

CROSS REFERENCE TO RELATED APPLICATION

This application claims priority to U.S. Provisional Patent Application No. 63/375,760, which was filed on Sep. 15, 2022. The contents of which is hereby incorporated by reference into this specification.

BACKGROUND

Many printed circuit boards (PCBs) have electronic traces that are integrally manufactured within the PCB. Electronic components may be soldered on top of the PCB or addition connections or traces may be added. It has been challenging to create a plurality of microscale electrical connections on a PCB.

SUMMARY

The present disclosure provides a method for printing traces on a substrate. The method comprises determining at least two first location points for a first trace and at least two second location points for a second trace. The first trace and the second trace traverse at least two surfaces of the substrate, including a first surface of the substrate and a second surface of the substrate. The first surface forms an angle with the second surface of less than 180 degrees. At least one of the at least two first location points is on the first surface and at least one of the at least two first location points is on the second surface. At least two third location points are determined for a third trace based on the at least two first location points and the at least two second location points. The third trace is intermediate the first trace and the second trace. The third trace is formed on the at least two surfaces based on the at least two third location points.

The present disclosure also provides an additive manufacturing apparatus.

It is understood that the inventions described in this specification are not limited to the examples summarized in this Summary. Various other aspects are described and exemplified herein.

BRIEF DESCRIPTION OF THE DRAWINGS

The features and advantages of the examples, and the manner of attaining them, will become more apparent, and the examples will be better understood, by reference to the following description taken in conjunction with the accompanying drawings, wherein.

Corresponding reference characters indicate corresponding parts throughout the several views. The exemplifications set out herein illustrate certain embodiments, in one form, and such exemplifications are not to be construed as limiting the scope of the appended claims in any manner.

DETAILED DESCRIPTION

Certain exemplary aspects of the present disclosure will now be described to provide an overall understanding of the principles of the structure, function, manufacture, and use of the compositions, methods, and products disclosed herein. One or more examples of these aspects are illustrated in the accompanying drawings. Those of ordinary skill in the art will understand that the devices and methods specifically described herein and illustrated in the accompanying drawings are non-limiting exemplary aspects and that the scope of the various examples of the present disclosure is defined solely by the claims. The features illustrated or described in connection with one exemplary aspect may be combined with the features of other aspects. Such modifications and variations are intended to be included within the scope of the present disclosure.

Any references herein to "various examples," "some examples," "one example," "an example," similar references to "aspects," or the like, means that a particular feature, structure, or characteristic described in connection with the example is included in at least one example. Thus, appearances of the phrases "in various examples," "in some examples," "in one example," "in an example," similar references to "aspects," or the like, in places throughout the specification are not necessarily all referring to the same example. Furthermore, the particular features, structures, or characteristics may be combined in any suitable manner in one or more examples. Thus, the particular features, structures, or characteristics illustrated or described in connection with one example may be combined, in whole or in part, with the features, structures, or characteristics of one or more other examples without limitation. Such modifications and variations are intended to be included within the scope of the present examples.

The present disclosure provides a method for printing traces on a substrate and an additive manufacturing apparatus configured to print traces on a substrate. Referring to FIGS. 1-4, an example method for printing traces on a substrate 102 according to the present disclosure is shown. The additive manufacturing apparatus 124 can be configured to perform the methods as described herein and can comprise various hardware components in addition to a nozzle 120 and a print head 122 to perform the methods as described herein. For example, the additive manufacturing apparatus 124 can additionally comprise a substrate stage, an ink feeding system, a print head positioning system (e.g., gantry), a hardware controller, a measuring machine, a laser, light detection and ranging (LIDAR), radar, a camera, and/or other measuring device. The substrate 102 can be in a fixed position on the substrate stage of the additive manufacturing apparatus 124 during formation of the traces.

Figure 1:
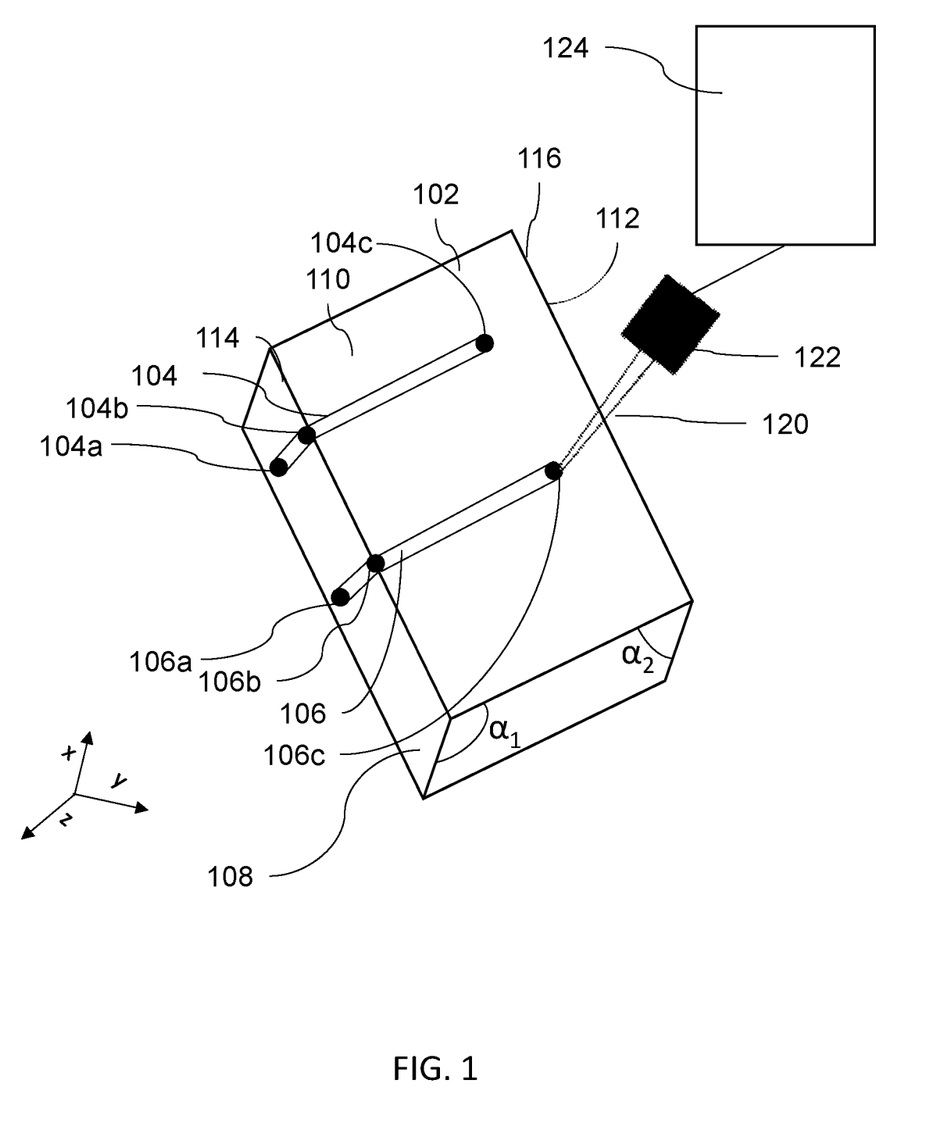
FIG. 1 is a perspective view of a substrate having two leading traces to be formed and an additive manufacturing apparatus according to the present disclosure.

Referring to FIG. 1, the substrate 102 can be a printed circuit board (PCB) or other electronic hardware component. For example, the substrate 102 can be at least partially coated with silicon and have various electronic components (e.g., pads, vias, resistors, capacitors, LEDs). The substrate 102 comprises a first surface 108, a second surface 110, a third surface 112, a first edge 114 intermediate the first surface 108 and the second surface 110, and a second edge 116 intermediate the second surface 110 and the third surface 112. In various examples, the first edge 114 is connected to and in contact with the first surface 108 and the second surface 110, and the second edge 116 is connected to and in contact with the second surface 110 and the third surface 112. As illustrated in FIG. 1, the substrate 102 is substantially rectangular. In various examples, the substrate 102 can be a different shape, such as for example, circular, triangular, pentagonal, hexagonal, or other shape.

As used herein, a referenced element or region that is "intermediate" two other elements or regions means that the referenced element/region is disposed between, but is not necessarily in contact with, the two other elements/regions. Accordingly, for example, a referenced element that is "intermediate" a first element and a second element may or may not be immediately adjacent to or in contact with the first and/or second elements, and other elements may be disposed between the referenced element and the first and/or second elements.

The first surface 108 forms a first angle, α1, with the second surface 110 of less than 180 degrees and the second surface 110 forms a second angle, α2, with the third surface 112 of less than 180 degrees. For example, each angle, α1 and α2, individually, can be in a range of 25 degrees to 165 degrees, such as, for example, 30 degrees to 150 degrees, 45 degrees to 135 degrees, 60 degrees to 120 degrees, 75 degrees to 105 degrees, or 80 degrees to 100 degrees. In various examples, the first surface 108 is perpendicular to the second surface 110 and/or the second surface 110 is perpendicular to the third surface 112.

Electrical connections can be formed on the substrate 102 that extend from the first surface 108 to at least the second surface 110 and optionally the third surface 112. The electrical connections may be substantially parallel to one another. These electrical connections can comprise traces, such as, for example, electrically conductive traces. In various examples, the electrically conductive traces can form electrical connections between pads on the substrate 102.

Figure 2:
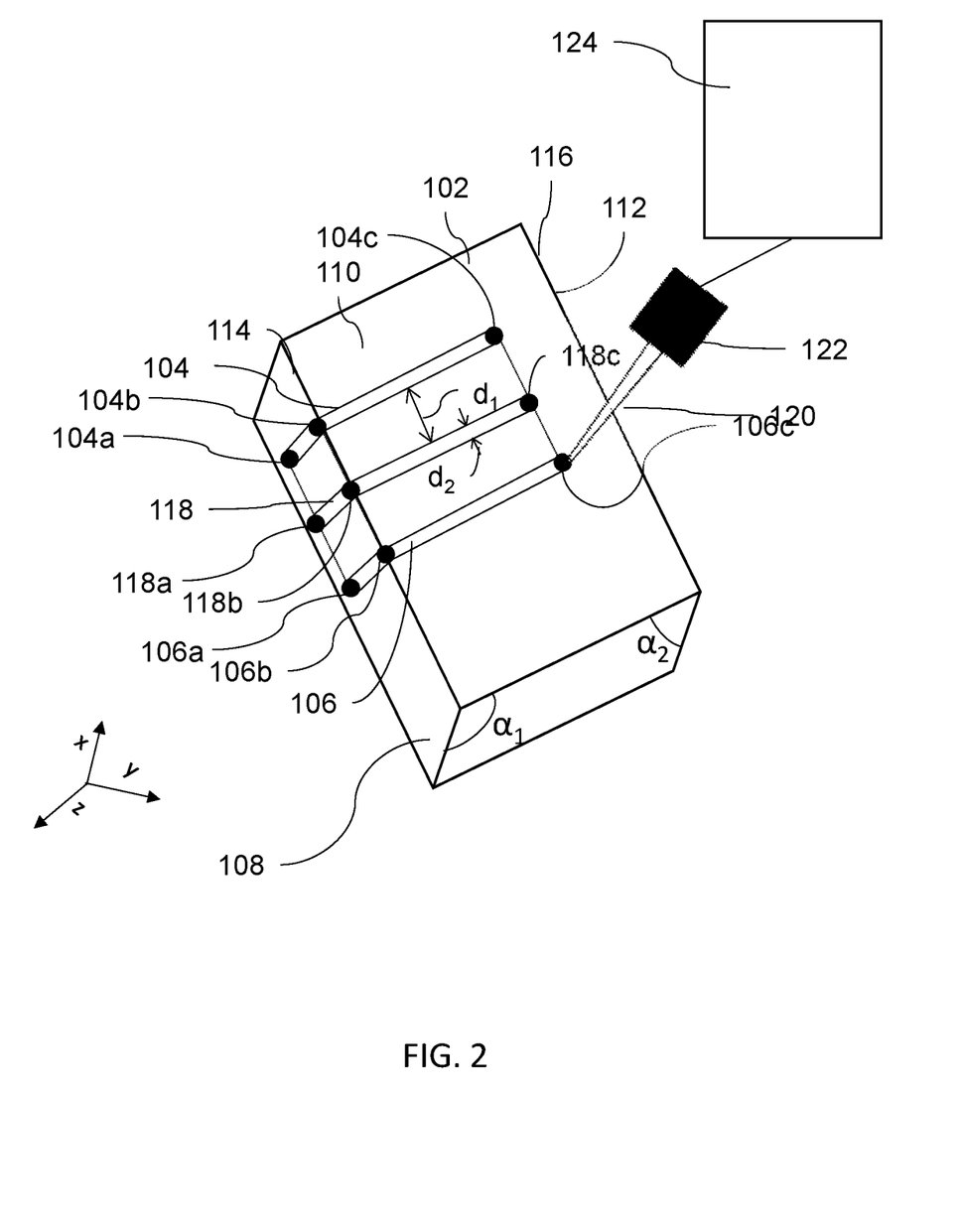
FIG. 2 is a perspective view of the substrate of FIG. 1 with a third trace to be formed based on the two leading traces.

To form traces on at least two of the surfaces, 108, 110, and 112 of the substrate 102, at least two first location points for a first trace 104 to be formed and at least two second location points for a second trace 106 to be formed are determined. The first trace 104 and the second trace 106 can modeled in a part file and the first trace 104 and the second trace 106 in FIGS. 1-2 illustrate the location where the respective traces 104 and 106 should be formed based on the respective location points and a part file. In various examples, at least three first location points for the first trace 104 and at least three second location points for the second trace 106 are determined. The first trace 104 and the second trace 106 traverse at least two surfaces of the substrate 102 including the first surface 108 of the substrate 102 and the second surface 110 of the substrate 102 and optionally, the third surface 112 of the substrate 102 as shown with respect to FIG. 4. Each location point can be three-dimensional coordinate, such as, for example, a Cartesian coordinate or a polar coordinate.

Referring again to FIG. 1, for each trace 104 and 106, at least one of the respective location points can be at least two of or at least three of the surfaces 108, 110, and 112 of the substrate 102 and optionally an edge 114 and 116 or at least two edges of the substrate 102 that the respective trace 104 and 106 traverses. For example, to form a trace extending from the first surface 108 to the second surface 110, at least one of the at least two location points can be on the first surface 108 and at least one of the at least two location points can be on the second surface 110. As illustrated in FIG. 1 for the first trace 104, a point 104a can be determined on the first surface 108, a point 104b can be determined on the first edge 114, and a point 104c can be determined on the second surface 110. The points 104a-104c can be grouped together as a set of points for the first trace 104 and stored in memory of the additive manufacturing apparatus.

For the second trace 106, a point 106a can be determined on the first surface 108, a point 106b can be determined on the first edge 114, and a point 106c can be determined on the second surface. The points 106a-106c can be grouped together as a set of points for the second trace 106 and stored in memory of the additive manufacturing apparatus 124. The sets of points can be used by the additive manufacturing apparatus to create machine path instructions to deposit ink on the substrate 102 to form the traces 104 and/or 106, the sets of points can be used to align predetermined machine path instructions with the substrate 102, and/or the set of points can be associated with a part file for the traces.

The determination of the points 104a-c and the points 106a-c can include measuring the physical location of the points 104a-c and the points 106a-c, which can be performed by various methods. For example, the physical location of the points 104a-c and the points 106a-c can be determined by a measuring machine, a laser, light detection and ranging (LIDAR), radar, a camera, or other measuring devices. In various examples, the physical location of the points 104a-c and the points 106a-c can be automatically measured by the additive manufacturing apparatus 124 and/or manually input by a user. In various examples, the points 104a-c and the points 106a-c can be determined by moving a nozzle 120 of a print head 122 of the additive manufacturing apparatus 124 adjacent to and/or in contact with each of the points 104a-c and the points 106a-c and determining a position of the nozzle 120 at each of the points 104a-c and the points 106a-c. The position of the nozzle 120 at each point 104a-c and 106a-c can be set as the physical position of the respective point 104a-c or 106a-c. The points 104a-c and the points 106a-c can be considered leading points as their physical location was measured or is otherwise predetermined.

In various examples, the points 104a-c and the points 106a-c can be determined by moving a nozzle 120 of a print head 122 of the additive manufacturing apparatus 124 adjacent to each of the points 104a-c and the points 106a-c and offset a first distance (e.g., greater than 0 μm to 20 μm) from the respective surface 108, 110 the points 104a-c and the points 106a-c are physically positioned on. A position of the nozzle 120 can be determined and the position of the nozzle 120 at each point 104a-c and 106a-c adjusted for the offset distance can be set as the physical position of the respective point 104a-c or 106a-c. In certain examples, the position of the nozzle 120 may not be adjusted for the offset distance.

At least two additional location points for an additional trace or additional traces to be formed can be determined by estimating the physical location of the additional location points based on the points 104a-c and points 106a-c. In various examples, at least three additional location points for an additional trace or additional traces to be formed can be determined by estimating the physical location of the additional location points based on the points 104a-c and the points 106a-c. For example, referring to FIG. 2, at least two third location points for a third trace 118 to be formed can be estimated based on the points 104a-104c and the points 106a-106c. For each additional trace, at least one of the respective additional location points can be on each surface and optionally edge that the traces comprising leading points traversed. For example, at least one of the at least third first location points can be on the first surface 108 and at least one of the at least two third location points can be on the second surface 110.

The quantity of location points for each trace to be formed on the substrate 102 can be the same. For example, a first quantity of the first location points for the first trace 104, a second quantity of the second location points for the second trace 106, and a third quantity of the third location points for a third trace 118 can be the same. The points 104a-c and 106a-c can be correlated to one another for estimation of the third trace 118. For example, the point 104a can be correlated with the point 106a as they both are on the first surface 108 and in a similar portion of the respective trace 104 or 106 (e.g., first point on the first surface 108). The point 104b can be correlated with point 106b (e.g., first point on the first edge 114) and the point 104c can be correlated with the point 106c (e.g., first point on the second surface 110). The correlation between points 104a-c and 106a-c can be used to estimate the third trace.

For the third trace 118, each location point can be estimated based on two or more correlated points. For example, the point 118a can be estimated on the first surface 108 based on the point 104a and the point 106a, the point 118b can be estimated on the first edge 114 based on the point 104b and the point 106b, and the point 118c can be estimated on the second surface 110 based on the point 104c and the point 106c.

The points 118a-c can be linearly interpolated from one of the points 104a-c and one of the points 106a-c. For example, the point 118a can be estimated based on a linear interpolation of the point 104a and the point 106a, the point 118b can be estimated based on a linear interpolation of the point 104b and the point 106b, and the point 118c can be estimated based on a linear interpolation of the point 104c and the point 106c. The points 118a-c can be estimated using other algorithms and/or functions, such as, for example, a curve connecting one of the points 104a-c and one of the points 106a-c. Regardless of the estimation technique, the points 118a-118c can be grouped together as a set of points for the third trace 118. In various examples, additional points can be grouped into separate sets for additional traces. The sets of additional points can be used by the additive manufacturing apparatus to create machine path instructions to deposit ink on the substrate 102 to form the third trace 118 and/or additional traces, the sets of points can be used to align predetermined machine path instructions with the substrate 102, and/or the set of points can be associated with a part file for the traces.

The quantity of additional traces can be based on the desired trace design and/or surface geometry of the substrate 102. For example, there may be a single additional trace, at least two additional traces, at least three additional traces, at least ten additional traces, at least twenty additional traces, at least fifty additional traces, or at least one hundred additional traces.

In various examples, the desired trace design is store in a part file in memory (e.g., non-transitory memory) of the additive manufacturing apparatus 124 and/or other device in communication with the additive manufacturing apparatus 124 or the desired trace design is automatically generated based on an input of the desired number of traces, desired trace spacing, and/or the points 104a-c and the points 106a-c. As illustrated in FIG. 2, the third trace 118 is intermediate the first trace 104 and the second trace 106. The location of the third trace 118 relative to the first trace 104 and/or the second trace 106 can be based on the desired trace design. For example, in a three trace system, the third trace 118 can be placed at a distance at a middle point between the first trace 104 and the second trace 106. In certain examples, the additional traces may be evenly spaced between the first trace 104 and the second trace 106 and/or the additional traces may be variably spaced between the first trace 104 and the second trace 106. In various examples, the additional traces and the first trace 104 and the second trace 106 can be substantially parallel.

A line distance, $d_1$, between the first trace 104 and the third trace 118 can be in a range of 1 μm to 1000 μm, such as, for example, 1 μm to 500 μm, 1 μm to 100 μm, 5 μm to 75 μm, 5 μm to 50 μm, 10 μm to 50 μm, 10 μm to 40 μm, or 1 μm to 10 μm. The line distance between each trace to be formed on the substrate 102, individually, can be in a range of 1 μm to 100 μm, such as, for example, 5 μm to 75 μm, 5 μm to 50 μm, 10 μm to 50 μm, 10 μm to 40 μm, or 1 μm to 10 μm.

A line width, $d_2$, of the third trace 118 can be in a range of 1 μm to 100 μm, such as, for example, 5 μm to 75 μm, 5 μm to 50 μm, 10 μm to 50 μm, 10 μm to 40 μm, or 1 μm to 10 μm. The line width of each trace on the substrate 102, individually, can be in a range of 1 μm to 100 μm, such as, for example, 5 μm to 75 μm, 5 μm to 50 μm, 10 μm to 50 μm, 10 μm to 40 μm, or 1 μm to 10 μm. In certain examples, each trace to be formed on the substrate 102 may have substantially the same line width and/or each trace to be formed may have variable line widths.

The traces 104, 106, 118, and any other additional traces can be at least partially formed on at least two surfaces 108, 110, and 112 of the substrate 102 based on the respective location points. For example, the third trace 118 can be formed on the first surface 108 and the second surface 110 based on the third location points 118a-118c. Forming can comprise depositing an ink and curing the ink on the substrate 102. For example, an ink can be extruded from the nozzle 120 onto the substrate 102 where each trace should be formed and curing the deposited ink.

As used herein, the terms "cure" and "curing" refer to the chemical crosslinking of components in an ink applied as a layer over a substrate and/or the physical drying of an ink through solvent or carrier evaporation.

As used herein, the terms "on," "applied over," "applied on," "formed over," "formed on, "deposited over," "deposited on," "overlay," "provided over," "provided on," and the like, mean formed, overlaid, deposited, or provided on but not necessarily in contact with the surface. For example, a formed layer "applied over" a substrate layer does not preclude the presence of one or more other layers of the same or different composition located between the formed layer and the substrate layer.

The ink can comprise various conductive components, such as, for example, a metal, a metal alloy, a conductive carbon, or a combination thereof. For example, the ink can comprise copper, a copper alloy, silver, a silver alloy, or a combination thereof. In various examples, the ink further comprises a solvent and/or a resin.

During forming, the nozzle 120 can start extruding at a position on a side (e.g., first surface 108 when the second surface 110 is facing towards the nozzle 120 in the direction of the X-axis) distal from the respective edge 114 and move towards the first edge 114 while extruding and then onto a different surface. For example, when the second surface 110 is facing towards the nozzle 120 and the first surface 108 is a side, the nozzle 120 may start extruding ink at point 104a for the first trace and move towards the point 104b on the first edge 114 and then to point 104c to deposit the ink. After deposition, the ink can be cured to form the first trace 104.

The nozzle 120 may deposit the portion of the third trace 118 on the first surface 108 at the same X-axis elevation. In various examples, the nozzle 120 moves in a first direction with respect to the first edge 114 (e.g., common edge to printing) to form at least a portion of a trace one the first surface 108 and in a second direction with respect to the first edge 114 opposite the first direction to form at least a portion of a trace on the second surface 110.

Figure 3:
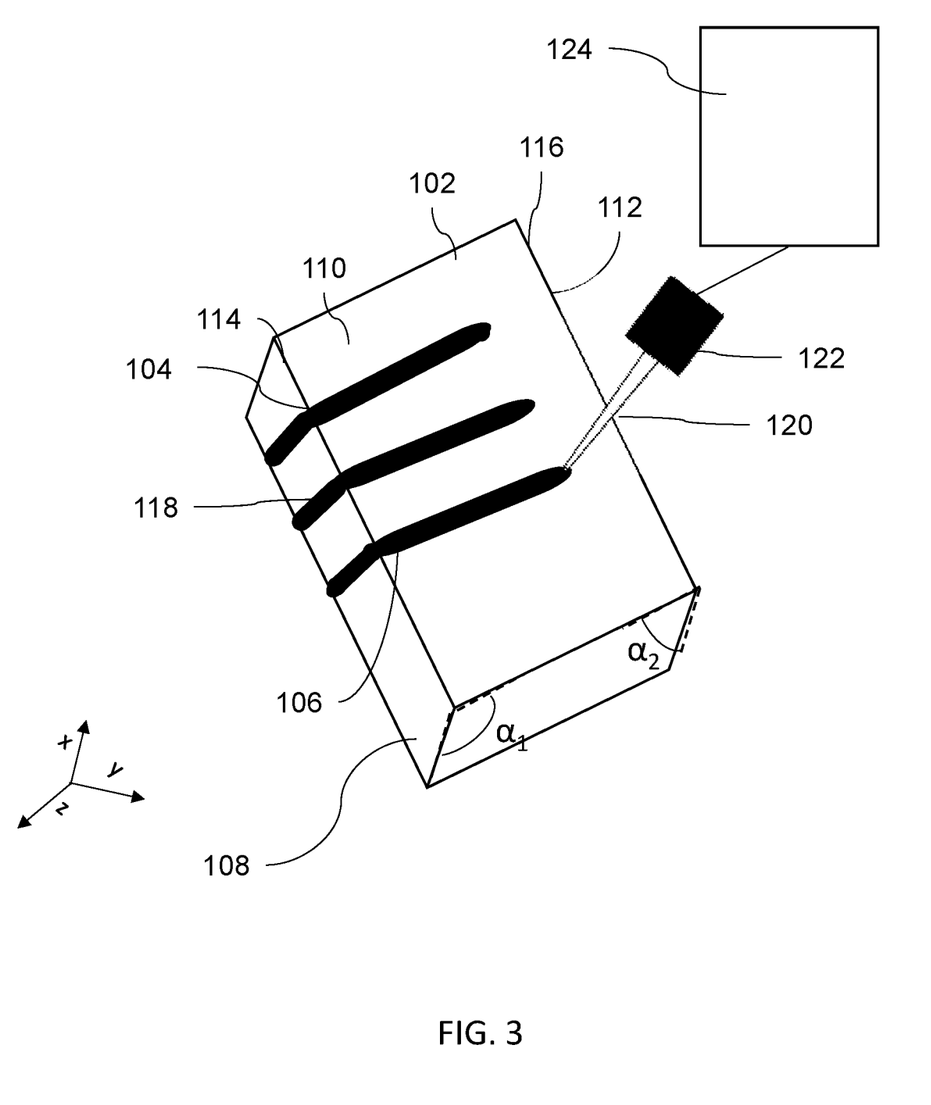
FIG. 3 is a perspective view of the substrate of FIG. 2 after formation of the traces.

The nozzle 120 may move and deposit ink according to machine path instructions stored in memory of the additive manufacturing apparatus and/or of memory of a device in signal communication with the additive manufacturing apparatus and/or machine path instructions otherwise generated based on the sets of points determined above. Referring to FIG. 3, each trace 104, 106, and 118, has been formed and cured. The traces 104, 106, and 118 can be continuous and electrically conductive from the first surface 108 to the second surface 110.

Figure 4:
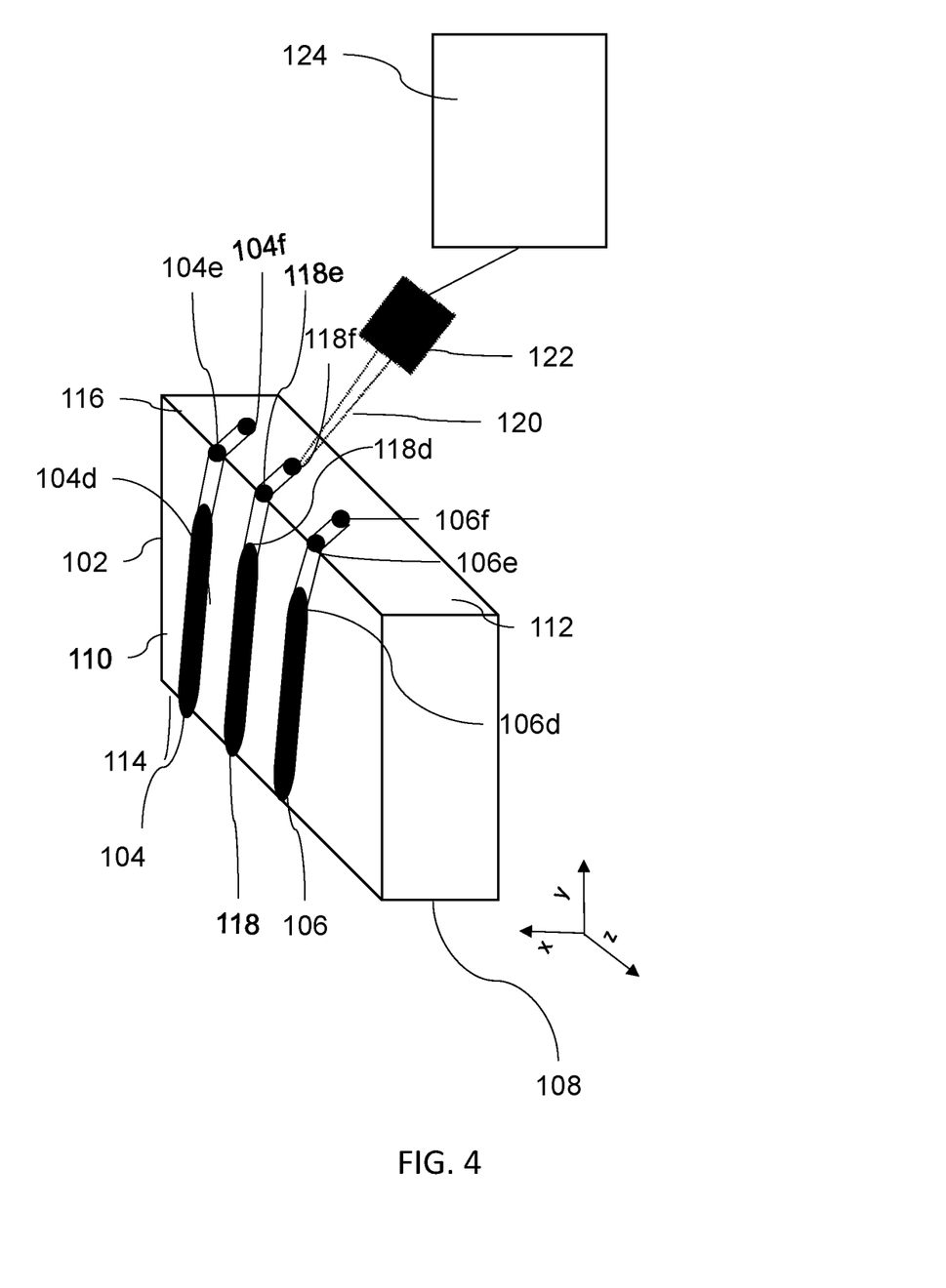
FIG. 4 is a perspective view of the substrate of FIG. 3 in a second orientation.

Referring to FIG. 4, the traces may extend to the third surface 112. The surfaces 108, 110, and 112 of the substrate 102 can be electrically connected by the traces 104, 106, and 118. In FIGS. 1-3, the nozzle 120 is in a first orientation with respect to the substrate 102. After forming the traces 104, 106, and 118 on the second surface 110, the substrate 102 can be rotated to a second orientation as shown in FIG. 4. For example, the substrate 102 and/or nozzle 120 can be rotated the degrees of the angle, α2, such that the third surface 112 is facing towards the nozzle 120 in the direction of an Y-axis. The rotation of the substrate 102 and/or nozzle 120 may occur as necessary to print the traces 104, 106, and 118, such as, for example, at least two times or at least three times.

In the second orientation illustrated in FIG. 4, at least two location points are determined for each leading trace. For example, at least two additional first location points for the first trace 104 and at least two additional second location points for the second trace 106 are determined. Points 104$d$-$f$ can be determined substantially the same as points 104$a$-$c$ described above and points 106$d$-$f$ can be determined substantially the same as points 106$a$-$c$ described above.

At least two additional location points can be determined for the third trace 118 and/or other additional traces based on the points 104$d$-$f$ and the points 106$d$-$f$. For example, points 118$d$-$f$ can be determined substantially the same as points 118$a$-$c$ described above. The traces 104, 106, 118, and any other additional traces can be at least partially formed on surfaces 110 and 112 of the substrate 102 based on the respective location points while the substrate 102 is in the second orientation with respect to the nozzle 120. The formation may occurs similarly as described with respect to FIGS. 2-3 above.

In various examples, each trace 104, 106, and 118 can connect at least two pads on the substrate 102 and the substrate 102 can be a printed circuit board. After formation of the traces 104, 106, and 110, an electrical current can be passed through a trace 104, 106, and 118 to disrupt surface oxides on at least a portion of the at least two pads. In certain examples, the electrical current can be applied with reversed polarity. The pads may comprise a multilayer composite including a first layer of titanium dioxide, a second layer of silver, a third layer of titanium dioxide. The titanium oxide can add resistance to the electrical path formed by the respective trace 104, 106, and 118. When an electrical current is applied above a threshold current (e.g., 5 mA to 25 mA) for a threshold time period (e.g., 5 seconds), the titanium dioxide layer may be subject to a dielectric breakdown and form titanium-silver conductive channels, thereby activating the electrical connection at the pad.

Various aspects of the invention include, but are not limited to, the aspects listed in the following numbered clauses.

Clause 1. A method for printing traces on a substrate, the method comprising:
determining at least two first location points for a first trace and at least two second location points for a second trace,
  wherein the first trace and the second trace traverse at least two surfaces of the substrate, including a first surface of the substrate and a second surface of the substrate,
  wherein the first surface forms an angle with the second surface of less than 180 degrees, and
  wherein at least one of the at least two first location points is on the first surface and at least one of the at least two first location points is on the second surface;
determining at least two third location points for a third trace based on the at least two first location points and the at least two second location points, wherein the third trace is intermediate the first trace and the second trace; and
forming the third trace on the at least two surfaces based on the at least two third location points.

Clause 2. The method of clause 1, wherein the first surface is perpendicular to the second surface.

Clause 3. The method of any of clauses 1-2, further comprising:
determining at least two additional location points for at least two additional traces based on the at least two first location points and the at least two second location points, wherein the at least two additional traces are intermediate the first trace and the second trace; and
forming at least a portion of the at least two additional traces on the at least two surfaces based on the at least two additional location points.

Clause 4. The method of any of clauses 1-3, wherein a first quantity of the at least two first location points, a second quantity of the at least two second location points, and a third quantity of the at least two third location points are the same.

Clause 5. The method of any of clauses 1-4, wherein each of the at least two third location points are linearly interpolated from one of the at least two first location points and one of the at least two second location points.

Clause 6. The method of any of clauses 1-5, wherein each of the at least two third location points are on a curve connecting one of the at least two first location points and one of the at least two second location points.

Clause 7. The method of any of clauses 1-6, wherein at least three first location points are determined for the first trace and at least three second location points are determined for the second trace and at least one of the at least three first location points is on an edge intermediate the first surface and the second surface.

Clause 8. The method of any of clauses 1-7,
wherein at least three first location points are determined for the first trace and at least three second location points are determined for the second trace,
wherein the first trace and the second trace traverse at least three surfaces of the substrate, including the first surface, the second surface, and a third surface, wherein the third surface forms an angle with the second surface of less than 180 degrees and at least one of the at least three first location points is on the third surface, wherein at least three third location points are determined for the third trace based on the at least three first location points and the at least three second location points; and forming the third trace on the at least three surfaces based on the at least three third location points.

Clause 9. The method of clause 8, further comprising rotating the substrate after forming at least a first portion of the third trace on the first surface.

Clause 10. The method of any of clauses 8-9, further comprising rotating the substrate at least two times in order to form the third trace on the at least three surfaces of the substrate.

Clause 11. The method of any of clauses 8-10, wherein at least a first portion of the third trace is formed on the first surface and at least a second portion of the third trace is formed the second surface while the substrate is in a first orientation.

Clause 12. The method of any of clauses 8-11, wherein the at least one of the at least three first location points on the third surface is determined after rotating the substrate.

Clause 13. The method of clause 12, wherein determining the at least two first location points for the first trace is performed by moving a nozzle of a print head of an additive manufacturing apparatus adjacent to each of the at least two first location points and determining a position of the nozzle at each of the at least two first location points.

Clause 14. The method of clause 13, wherein the third trace is formed by extruding an ink composition from the nozzle.

Clause 15. The method of clause 14, wherein the nozzle moves in a first direction relative to an edge to form at least a first portion of the third trace on the first surface and a second direction opposite the first direction to form at least a second portion of the third trace on the second surface.

Clause 16. The method of any of clauses 1-15, wherein a line distance between each trace is in a range of 11 μm to 1000 μm.

Clause 17. The method of any of clauses 1-16, wherein a line distance between each trace is in a range of 11 μm to 100 μm.

Clause 18. The method of any of clauses 1-17, wherein a line width of each trace is in a range of 11 μm to 100 μm.

Clause 19. The method of any of clauses 1-18, wherein the third trace is electrically conductive and the substrate is a printed circuit board.

Clause 20. The method of clause 19, wherein the third trace connects at least two pads on the printed circuit board and the method further comprises applying an electrical current through the third trace to disrupt surface oxides on at least a portion of the at least two pads.

Clause 21. The method of clause 20, wherein the electrical current is applied with reversed polarity.

Clause 22. An additive manufacturing apparatus configured to perform the method of any of clauses 1-21.

In this specification, unless otherwise indicated, all numerical parameters are to be understood as being prefaced and modified in all instances by the term "about", in which the numerical parameters possess the inherent variability characteristic of the underlying measurement techniques used to determine the numerical value of the parameter. At the very least, and not as an attempt to limit the application of the doctrine of equivalents to the scope of the claims, each numerical parameter described herein should at least be construed in light of the number of reported significant digits and by applying ordinary rounding techniques.

Also, any numerical range recited herein includes all sub-ranges subsumed within the recited range. For example, a range of "1 to 10" includes all sub-ranges between (and including) the recited minimum value of 1 and the recited maximum value of 10, that is, having a minimum value equal to or greater than 1 and a maximum value equal to or less than 10. Any maximum numerical limitation recited in this specification is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited.

The grammatical articles "a," "an," and "the," as used herein, are intended to include "at least one" or "one or more," unless otherwise indicated, even if "at least one" or "one or more" is expressly used in certain instances. Thus, the articles are used herein to refer to one or more than one (i.e., to "at least one") of the grammatical objects of the article. Further, the use of a singular noun includes the plural, and the use of a plural noun includes the singular, unless the context of the usage requires otherwise.

Any patent, publication, or other disclosure material identified herein is incorporated by reference into this specification in its entirety unless otherwise indicated, but only to the extent that the incorporated material does not conflict with existing descriptions, definitions, statements, or other disclosure material expressly set forth in this specification. As such, and to the extent necessary, the express disclosure as set forth in this specification supersedes any conflicting material incorporated by reference. Any material, or portion thereof, that is said to be incorporated by reference into this specification, but which conflicts with existing definitions, statements, or other disclosure material set forth herein, is only incorporated to the extent that no conflict arises between that incorporated material and the existing disclosure material. Applicants reserve the right to amend this specification to expressly recite any subject matter, or portion thereof, incorporated by reference herein.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

One skilled in the art will recognize that the herein-described components, devices, operations/actions, and objects, and the discussion accompanying them, are used as examples for the sake of conceptual clarity and that various configuration modifications are contemplated. Consequently, as used herein, the specific examples/embodiments set forth and the accompanying discussion are intended to be representative of their more general classes. In general, use of any specific exemplar is intended to be representative of its class, and the non-inclusion of specific components, devices, operations/actions, and objects should not be taken limiting. While the present disclosure provides descriptions of various specific aspects for the purpose of illustrating various aspects of the present disclosure and/or its potential applications, it is understood that variations and modifications will occur to those skilled in the art. Accordingly, the invention or inventions described herein should be understood to be at least as broad as they are claimed and not as more narrowly defined by particular illustrative aspects provided herein.

What is claimed is:

1. A method for printing traces on a substrate, the method comprising:
    measuring at least two first location points on the substrate for a first trace and at least two second location points on the substrate for a second trace,
        wherein the first trace and the second trace traverse at least two surfaces of the substrate, including a first surface of the substrate and a second surface of the substrate,
        wherein the first surface forms an angle with the second surface of less than 180 degrees, and
        wherein at least one of the at least two first location points is on the first surface and at least one of the at least two first location points is on the second surface;
    estimating at least two third location points on the substrate for a third trace based on correlating the at least two first location points with the at least two second location points, wherein the third trace is intermediate the first trace and the second trace;
    generating machine path instructions for forming the first trace, the second trace, and the third trace based on the at least two first location points, the at least two second location points, and the at least two third location points; and
    automatically forming the first trace, the second trace, and the third trace on the substrate based on the machine path instructions.

2. The method of claim 1, wherein the first surface is perpendicular to the second surface.

3. The method of claim 1, further comprising:
    estimating at least two additional location points on the substrate for at least two additional traces based on the at least two first location points and the at least two second location points, wherein the at least two additional traces are intermediate the first trace and the second trace;
    generating additional machine path instructions for the at least two additional traces based on the at least two additional location points; and
    forming at least a portion of the at least two additional traces on the at least two surfaces based on the additional machine path instructions.

4. The method of claim 1, wherein a first quantity of the at least two first location points, a second quantity of the at least two second location points, and a third quantity of the at least two third location points are the same.

5. The method of claim 1, wherein each of the at least two third location points are linearly interpolated from one of the at least two first location points and one of the at least two second location points.

6. The method of claim 1, wherein each of the at least two third location points are on a curve connecting one of the at least two first location points and one of the at least two second location points.

7. The method of claim 1, wherein at least three first location points are measured for the first trace and at least three second location points are measured for the second trace and at least one of the at least three first location points is on an edge intermediate the first surface and the second surface.

8. The method of claim 1,
    wherein at least three first location points are measured for the first trace and at least three second location points are measured for the second trace,
    wherein the first trace and the second trace traverse at least three surfaces of the substrate, including the first surface, the second surface, and a third surface,
    wherein the third surface forms an angle with the second surface of less than 180 degrees and at least one of the at least three first location points is on the third surface,
    wherein at least three third location points are estimated for the third trace based on the at least three first location points and the at least three second location points; and
    wherein the third trace is formed on the at least three surfaces based on the at least three third location points.

9. The method of claim 8, further comprising rotating the substrate after forming at least a first portion of the third trace on the first surface.

10. The method of claim 8, further comprising rotating the substrate at least two times in order to form the third trace on the at least three surfaces of the substrate.

11. The method of claim 8, wherein at least a first portion of the third trace is formed on the first surface and at least a second portion of the third trace is formed the second surface while the substrate is in a first orientation.

12. The method of claim 8, wherein the at least one of the at least three first location points on the third surface is measured after rotating the substrate.

13. The method of claim 12, wherein measuring the at least two first location points for the first trace is performed by moving a nozzle of a print head of an additive manufacturing apparatus adjacent to each of the at least two first location points and determining a position of the nozzle at each of the at least two first location points.

14. The method of claim 13, wherein the third trace is formed by extruding an ink composition from the nozzle.

15. The method of claim 14, wherein the nozzle moves in a first direction relative to an edge to form at least a first portion of the third trace on the first surface and a second direction opposite the first direction to form at least a second portion of the third trace on the second surface.

16. The method of claim 1, wherein a line distance between each trace is in a range of 1 µm to 1000 µm.

17. The method of claim 1, wherein a line distance between each trace is in a range of 1 µm to 100 µm.

18. The method of claim 1, wherein a line width of each trace is in a range of 1 µm to 100 µm.

19. The method of claim 1, wherein the third trace is electrically conductive and the substrate is a printed circuit board.

20. The method of claim 19, wherein the third trace connects at least two pads on the printed circuit board and the method further comprises applying an electrical current through the third trace to disrupt surface oxides on at least a portion of the at least two pads.

21. The method of claim 20, wherein the electrical current is applied with reversed polarity.

* * * * *